United States Patent
Kono et al.

(10) Patent No.: US 7,705,418 B2
(45) Date of Patent: Apr. 27, 2010

(54) SEMICONDUCTOR DEVICE AND FUSE BLOWOUT METHOD

(75) Inventors: Kazushi Kono, Tokyo (JP); Takeshi Iwamoto, Tokyo (JP); Toshiaki Yonezu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 899 days.

(21) Appl. No.: 11/425,573

(22) Filed: Jun. 21, 2006

(65) Prior Publication Data

US 2006/0289898 A1  Dec. 28, 2006

(30) Foreign Application Priority Data

Jun. 22, 2005 (JP) ............................. 2005-181617

(51) Int. Cl.
*H01L 21/82* (2006.01)
(52) U.S. Cl. ................ 257/529; 257/207; 257/E23.149
(58) Field of Classification Search ................ 257/209, 257/529, E23.149, 355, 665, 758, E21.592; 438/132
See application file for complete search history.

(56) References Cited

U.S. PATENT DOCUMENTS

| 6,054,893 | A  | * | 4/2000  | Singh | 327/525 |
| 2004/0262710 | A1 | * | 12/2004 | Ueda  | 257/529 |
| 2005/0029620 | A1 | * | 2/2005  | Ueda  | 257/529 |

FOREIGN PATENT DOCUMENTS

| JP | 3-28737  | 3/1991 |
| JP | 6-140510 | 5/1994 |

* cited by examiner

*Primary Examiner*—Matthew Smith
*Assistant Examiner*—Quovaunda Jefferson
(74) *Attorney, Agent, or Firm*—Oblon, Spivak, McClelland, Maier & Neustadt, L.L.P.

(57) ABSTRACT

A fuse includes a fuse portion laid in such a manner that the direction of each turn of the fuse portion is parallel to the direction in which pads are arranged. The distance between the pads and the fuse portion is defined as the distance between the side of a pad facing the fuse portion and the pad nearest to the turn facing the particular side. The distance between the turn of the fuse portion and the nearest pad is the distance between the pads and the fuse portion. The pads and the fuse portion are distant from each other by a length at least ten times the width of the fuse.

5 Claims, 10 Drawing Sheets

F I G . 1
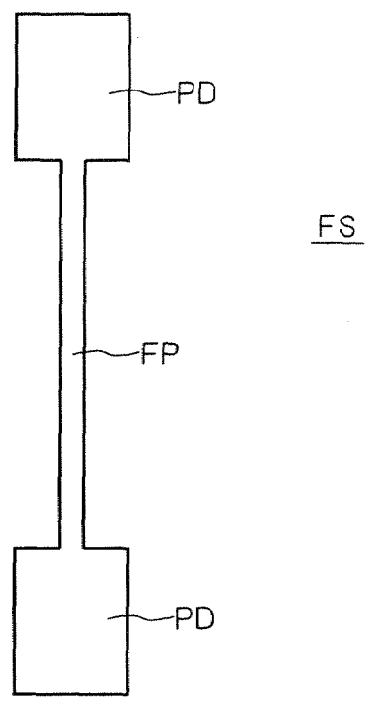
F I G . 2
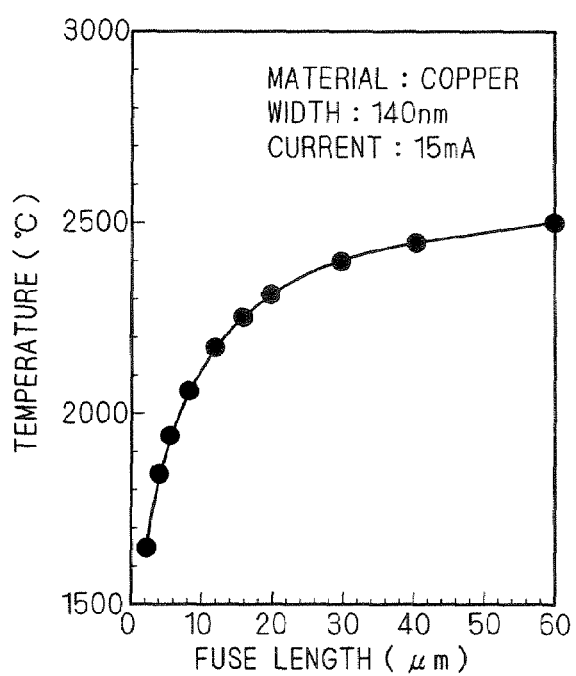

SEMICONDUCTOR DEVICE AND FUSE BLOWOUT METHOD

BACKGROUND OF THE INVENTION

1. Field of the Invention

The present invention relates to a semiconductor device and fuse blowout method. In particular, the present invention relates to a semiconductor device having a current blown fuse and a fuse blowout method.

2. Description of the Background Art

In a semiconductor device of a large capacity recently developed, it is technically difficult to fabricate all memory cells of a memory unit without problems to operate normally, and in the case where a failure memory cell is found in the fabrication stage, a memory array (column array, row array) having the failure memory cell is replaced with a spare memory array prepared in advance. For this purpose, redundant circuits of memory arrays in the number estimated from the rate of failure are prepared.

This prevents a semiconductor device itself from being a failure product and allows increase in a manufacturing yield of the semiconductor device.

The connection and disconnection between the memory array having a failure memory cell and the spare memory array are switched by a fuse. Generally, a column decoder and a row decoder of the peripheral circuits are configured so that the memory array having a failure memory cell cannot be selected while a spare memory can be selected by blowing the fuse.

The fuse blowout methods include a method using the laser beam and a method using electricity. The blowout method using the laser beam poses the problem that the fuse for the semiconductor device only in wafer form can be blown out and the process is complicated.

In the electrical blowout method, on the other hand, the fuse for the semiconductor can be blown out not only in wafer state but also after being packaged.

Further, the electrical blowout method is roughly divided into two categories.

One category is what is called the antifuse method using a fuse of a structure having electrodes arranged with an insulating film therebetween, in which the states of "0" and "1" are programmed by impressing the two electrodes with such a voltage as to cause the dielectric breakdown of the insulating film. The other method is a current blown fuse method using a fuse having the configuration of a conductive layer, which is programmed by blowing out the fuse with at least a rated current.

The current blown fuse is configured of a linear fuse portion actually blown out and fuse lead portions at the ends of the fuse portion. The fuse portion is designed to be thinner than the fuse lead portions. This is in order to increase the current density locally by efficient joule heat generation in the fuse portion and to facilitate the blowout of the fuse portion with a small current.

In this way, the current blown fuse is blown out utilizing the joule heat generation by the current supplied. The blowout of the fuse, therefore, requires a current of at least several tens of mA, which in turn requires a power supply having a large current output, and the effect that the heat generated by the fuse blowout has on the environment poses a problem.

In order to solve these problems, the reduction of the current required for fuse blowout is effective, and a fuse structure disclosed in Japanese Patent Application Laid-Open No. 06-140510 (1994), for example, has been proposed as a method to reduce the current.

Specifically, Japanese Patent Application Laid-Open No. 06-140510 (1994) discloses a technique in which the fuse portion assumes no simple linear form, but includes at least one crank portion at which the current is concentrated to increase the current density, so that the fuse is blown out with a small amount of current.

Japanese Utility Model Application Laid-Open No. 03-28737 (1991) (FIGS. 1, 2), on the other hand, discloses a structure in which the fuse portion is folded back with a plurality of turns into a meandering form to reduce the occupied area.

In Japanese Patent Application Laid-Open No. 06-140510 (1994), as shown in FIG. 2, the current density increases in the crank portion. In the other portions, however, the current density decreases and the effect of the current density increases in the crank position is offset. As compared with the linear fuse, therefore, no conspicuous effect is not expected.

In Japanese Utility Model Application Laid-Open No. 03-28737 (1991), on the other hand, the fuse assumes a meandering form to reduce the occupied area. The effect of reducing the blowout current, however, is not clear, and it is concluded that the blowout current is not reduced for not less than a predetermined length of the fuse portion. Therefore, the fuse structure is not considered to have been optimized.

SUMMARY OF THE INVENTION

An object of the present invention is to provide a semiconductor device including a current blown fuse and a fuse blowout method optimized to reduce the blowout current.

According to a first aspect of the present invention, a semiconductor device includes a semiconductor substrate, and a fuse adapted to be blown out by a current. Herein, the fuse has a fuse portion with the fuse wire folded back into a meandering form in a plane parallel to a main surface of the semiconductor substrate, and two rectangular pads connected to the ends, respectively, of the fuse portion and having each side thereof larger than the width of the fuse wire. The two pads are arranged at a distance from the fuse portion not less than ten times the width of the fuse wire.

As described above, the fuse has a fuse portion folded into a meandering form in a plane parallel to the main surface of the semiconductor substrate, and therefore, the fuse can be efficiently heated. Also, in view of the fact that each of the two pads is distant from the fuse portion by a length at least ten times the width of the fuse wire, the suppression of the temperature increase is prevented which otherwise might be caused by the absorption of the heat dissipated from the fuse portion into the pads.

According to a second aspect of the present invention, a semiconductor device includes a semiconductor substrate, and a fuse adapted to be blown out by a current. Herein, the fuse includes a fuse portion with a fuse wire folded into a meandering form in a plane perpendicular to the main surface of the semiconductor substrate, and two rectangular pads connected to the ends, respectively, of the fuse portion and having each side thereof larger than the width of the fuse wire. The fuse portion is arranged in a multi-layer layer insulating film arranged on the semiconductor substrate, and includes a plurality of linear fuse wires extending in parallel to the main surface of the semiconductor substrate in vertical layers with the layer insulating films held therebetween, and a plurality of via contacts for connecting the fuse wires. Each of the plurality of the via contacts is arranged so that the current path of the fuse portion assumes a meandering form.

As described above, the fuse includes the fuse portion in meandering form folded in a plane perpendicular to the main surface of the semiconductor substrate, and therefore the fuse can be efficiently heated.

According to a third aspect of the present invention, a fuse blowout method for blowing out a fuse arranged in a semiconductor device by a current includes a step (a) of supplying the current to the fuse in pulse form a plurality of times.

In this method, in view of the fact that the current is applied in pulses to the fuse a plurality of times, a larger amount of heat can be supplied to the fuse than the continuous current application with the same current supplied for the same time length, and therefore the current required for fuse blowout can be reduced. Also, the current application in pulse form can suppress the thermal effect on the fuse environment.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a fuse having a linear fuse portion;

FIG. 2 is a diagram showing the maximum temperature reachable with the change in the length of the linear fuse portion;

DESCRIPTION OF THE PREFERRED EMBODIMENTS

Prior to the explanation of a first embodiment of the present invention, an explanation is made about the reduction in the blowout current for a fuse FS having a simple linear fuse portion FP as shown in FIG. 1.

FIG. 1 is a plan view of the fuse FS having two pads PD connected to the ends, respectively, of the fuse portion FP.

Assume that the length of the fuse portion FP having the width of 140 nm and the thickness of 225 nm and made of copper (Cu) is variously changed. The result of calculating, by the finite element method, the maximum temperature reachable by supplying the current of 15 mA is shown in FIG. 2.

In FIG. 2, the abscissa represents the length (μm) of the fuse portion FP and the ordinate represents the maximum temperature (° C.) that is reached.

As shown in FIG. 2, the maximum temperature reachable by the fuse portion FP increases at a comparatively steep angle for up to 20 μm in the length of the fuse portion FP. For the length larger than 20 μm, however, the temperature characteristic curve tends to be saturated. The current of the same value being applied to the fuse, therefore, an excessively short fuse length would make it impossible for the fuse portion FP to reach the temperature required for blowout, and the fuse could not be blown out.

In the case where the fuse is lengthened, on the other hand, the maximum temperature reachable increases. For the fuse length larger than 20 μm, however, the maximum temperature is not increased for the length, and therefore the design of the semiconductor device is limited.

Figure 3:
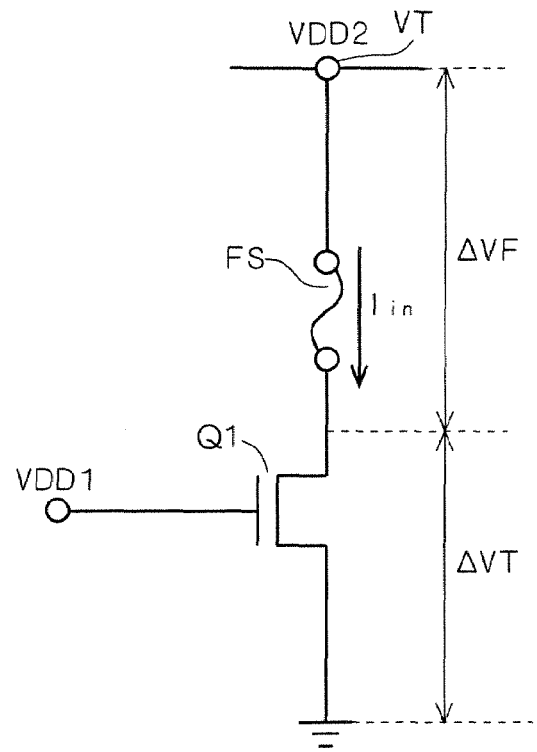
FIG. 3 is a diagram for explaining a minimum constituent unit configured of a fuse and a MOS transistor for fuse selection.

Specifically, in the case where the current blown fuse is mounted on the semiconductor device, the minimum constituent unit is considered to include the fuse FS and the MOS transistor Q1 for fuse selection as shown in FIG. 3.

In the configuration shown in FIG. 3, the fuse FS and the MOS transistor Q1 are connected in series between a power terminal VT and the ground, and the gate electrode of the MOS transistor Q1 is impressed with a control voltage VDD1.

In this configuration, the control voltage VDD1 is applied to the gate electrode of the MOS transistor Q1 while the power terminal VT is impressed with the supply voltage VDD2, so that the MOS transistor Q1 is turned on and the blowout current Iin is supplied to the fuse FS. In the process, the control voltage VDD1 and the supply voltage VDD2 that can be applied to the MOS transistor Q1 are limited in terms of hardware.

In a logic IC having only the 3.3 V-type MOS transistor therein, for example, the control voltage VDD1 and the supply voltage VDD2 applicable are 3.3 V in maximum. This value tends to decrease with the increase in capacity and integration.

Figure 4:
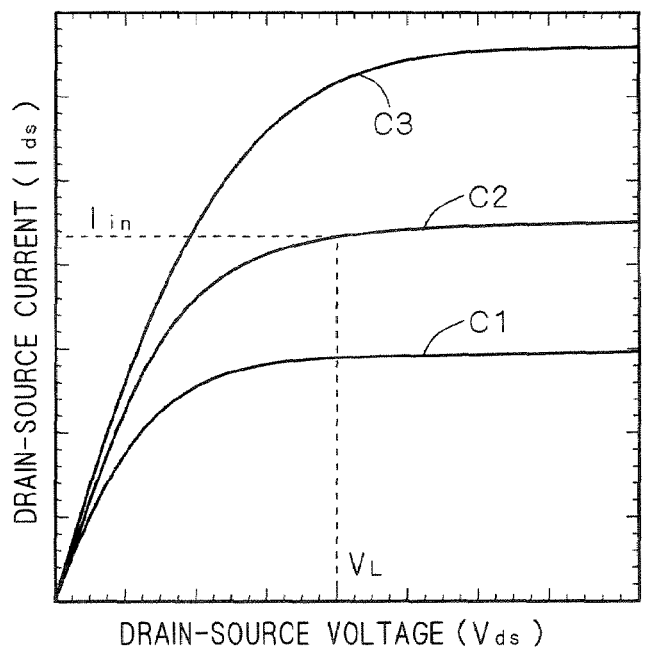
FIG. 4 is a diagram showing the I-V characteristic of the transistor.

Generally, in order to reduce the effect of the variations of the transistor characteristic attributable to the process variations during the fabrication of the MOS transistor, what is called the saturation area in the I-V characteristic of the transistor is used as shown in FIG. 4.

Specifically, in FIG. 4, the abscissa represents the drain-source voltage Vds, and the ordinate represents the drain-source current Ids, and the drain-source voltage Vds is set to secure the desired blowout current Iin (i.e., the drain-source current Ids). In the process, the characteristic curve is selected taking the use in the saturation area and the acquisition of the blowout current Iin into consideration as conditions.

In the case of FIG. 4, the characteristic curve C1 is such that the blowout current Iin cannot be supplied even in the case where the saturation area is reached, and according to the characteristic curve C3, the blowout current Iin is improperly supplied before reaching the saturation area. Therefore, only the characteristic curve C2 meets all the conditions.

In the case where the characteristic curve C2 is used, the lower limit value of the drain-source voltage Vds required to secure the blowout current Iin is VL.

In the case where the MOS transistor Q1 is of 3.3 V type having this characteristic, assume that the blowout current Iin is supplied to the fuse FS. The voltage drop ΔVF across the fuse portion is required to satisfy Equation 1 below.

$$\Delta VF < 3.3 - VL \qquad (1)$$

The fuse length is designed to meet this condition, and a limitation is imposed on the semiconductor device design to increase the fuse length.

As described above, the reduction of the fuse blowout current simply by optimizing the length of the fuse portion FP has its own limitation. In spite of this limitation, according to the present invention, the blowout is made possible with a smaller amount of current by employing a structure in which the fuse portion can be efficiently heated.

A. First Embodiment

A-1. Device Configuration

Figure 5:
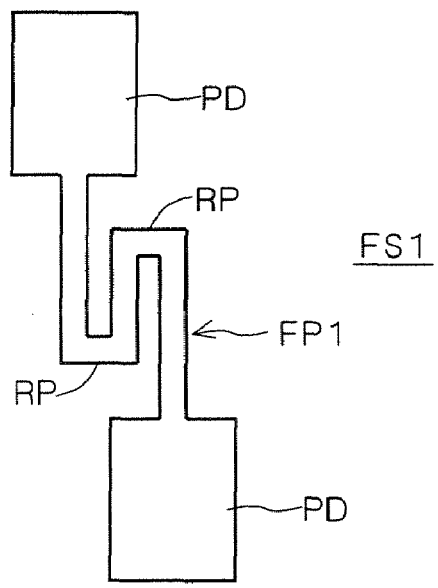
FIG. 5 is a plan view of a fuse according to a first embodiment of the present invention.

FIG. 5 is a plan view showing a fuse FS1 according to the first embodiment of the present invention.

As shown in FIG. 5, the fuse FS1 includes a meandering fuse portion FP1 having two turns RP and two pads PD connected to the ends, respectively, of the fuse portion FP1. The total length of the fuse portion FP of the fuse FS shown in FIG. 1 is equal to the total length of the fuse portion FP1 of the fuse FS1 shown in FIG. 5.

In designing the fuse FS1, first, the length of the fuse portion FP1 is optimized as the first step to reduce the fuse blowout current.

A-2. Optimization of Fuse Length

In optimizing the length of the fuse portion FP1, assume that a fuse adapted to blow out with 15 mA is fabricated of copper and the fuse portion FP1 is 0.14 μm wide and 0.225 μm thick.

Figure 6:
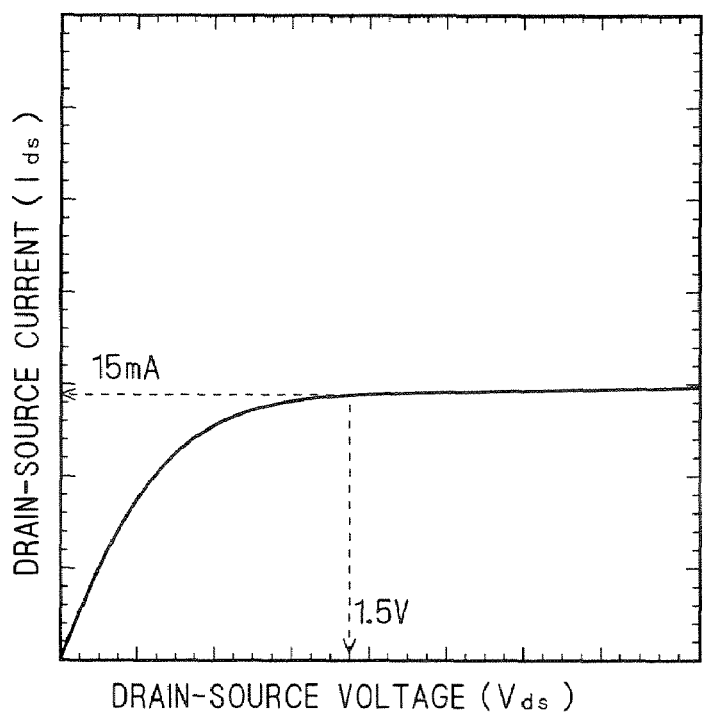
FIG. 6 is a diagram showing the I-V characteristic of the transistor.

An MOS transistor having the I-V characteristic as shown in FIG. 6 is used for supplying the current of 15 mA.

Specifically, in order to secure the drain-source current of 15 mA in the saturation area, an MOS transistor is used of which the lower limit VL of the drain-source voltage is 1.5 V.

In the case where the supply voltage VDD2 up to 3.5 V can be applied in the minimum constituent unit shown in FIG. 3, the MOS transistor Q1 is required to be continuously impressed with the drain-source voltage not less than the lower limit voltage VL of 1.5 V. The limit of the voltage drop ΔVF tolerable for the fuse portion FP during the fuse blowout is 2.0 V.

Since the sheet resistance of the copper wire is 0.15 Ω/μm², the fuse resistance value RF for the length L of the fuse portion FP is expressed by Equation 2.

$$RF = (0.15 \times L)/0.14 \qquad (2)$$

The resistance value of the fuse, on the other hand, increases with fuse temperature. The temperature dependency of the electric resistivity of representative fuse materials is shown in Table 1.

TABLE 1

Temperature dependency of electric resistivity of fuse materials (Ω · m)

| Temperature (° C.) | Al | W | Cu | Co |
|---|---|---|---|---|
| −195 | 0.21 | 0.6 | 0.2 | 0.9 |
| 0 | 2.5 | 4.9 | 1.55 | 5.6 |
| 100 | 3.55 | 7.3 | 2.23 | 9.5 |
| 300 | 5.9 | 12.4 | 3.6 | 19.7 |
| 700 | 24.7 | 24 | 6.7 | 48 |
| 1200 | 32.1 | 39 | 21.3 | 88.5 |

Table 1 shows the electric resistivity of aluminum (Al), tungsten (W), copper (Cu) and cobalt (Co), as an example, at the temperatures of −195° C., 0° C., 100° C., 300° C., 700° C. and 1200° C.

From Table 1, it is understood that in the case where copper is heated to 1200° C. near the melting point, the electric resistivity thereof increases to about 13 times as large as that for 0° C.

The fuse is required to be designed actually on the assumption that the fuse resistance is highest. For the temperature of 1200° C., as described above, the fuse resistance increases as much as about 13 times, and therefore, the voltage drop ΔVF occurred in the fuse portion FP at the time of fuse blowout with the blowout current of 15 mA is expressed by Equation 3 below.

$$\Delta VF = (0.15 \times L \times 0.015 \times 13)/0.14 \qquad (3)$$

As explained earlier, the voltage drop ΔVF is required to be not more than 2.0 V. Thus, the length L of the fuse portion FP is smaller than 9.57 μm and the upper limit of the fuse length is determined.

The lower limit of the fuse length, on the other hand, is required to be not less than 2.0 μm from the characteristic of the maximum temperature reachable shown in FIG. 2, and therefore the length of the fuse portion FP1 is desirably set in the range of 2.0 to 9.5 μm.

By setting the length of the fuse portion FP1 in the manner described above, the fuse blowout current can be reduced.

A-3. Optimization of Meandering Form

Next, the meandering form of the fuse portion FP1 is optimized based on the length 2.0 to 9.5 μm of the fuse portion FP1 determined by the above-mentioned method.

Figure 7:
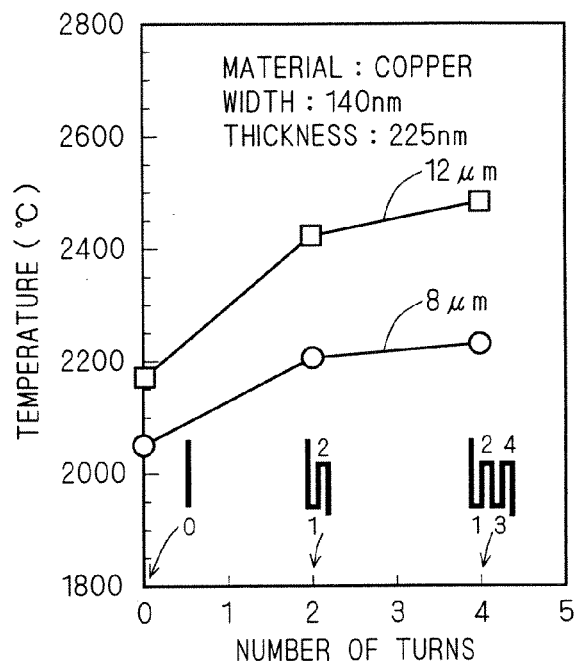
FIG. 7 is a diagram showing the relation between the number of turns where the fuse portion is folded and the maximum temperature reachable.

FIG. 7 is a diagram showing the relation between the number of turns of the fuse portion and the maximum temperature reachable. The abscissa represents the number of turns of the fuse portion and the ordinate represents the maximum temperature reachable. The cases for the fuse length of 8 μm (indicated by circular mark) and 12 μm (indicated by square mark) are shown. The material, width and thickness of the fuse are as explained previously, and a current of 15 mA is supplied.

FIG. 7 shows both a case in which the fuse portion is linear, i.e., the number of turns is zero, a case in which the number of turns is 2 and a case in which the number of turns is 4. It is understood that for zero turn, the maximum temperature reachable is about 2200° C. for the fuse length of 12 μm, while for two turns, the maximum temperature of 2200° C. is reached even for the fuse length of 8 μm. The case for the fuse length of 12 μm, though not optimized, is shown for comparison.

Even for the same fuse length, as described above, the fuse can be heated more efficiently for the same current in the meandering form with turns.

The reason is described with reference to FIGS. 8 and 9.

Figure 8:
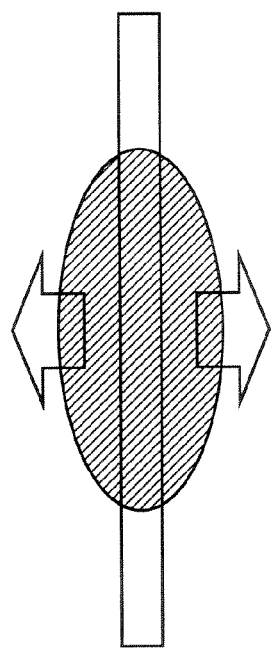
FIG. 8 is a diagram schematically showing the linear fuse portion.

FIG. 8 is a diagram schematically showing the linear fuse portion, and when a current is supplied to this fuse portion, the central portion thereof is generally blown out. The heat at the central fuse portion is dissipated in four directions therefrom.

Figure 9:
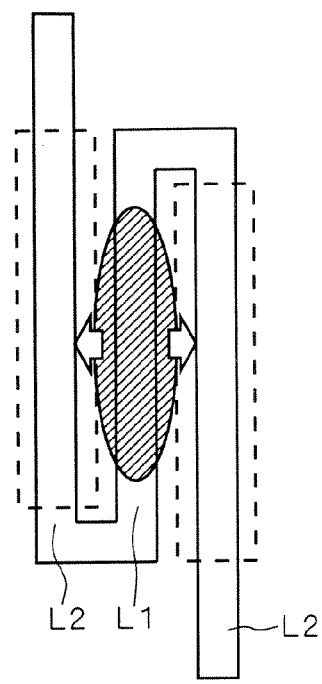
FIG. 9 is a diagram schematically showing a meandering fuse portion having two turns.

FIG. 9, on the other hand, schematically shows a meandering fuse portion having two turns. Also with this fuse portion, the blowout occurs at the central portion thereof. The side lines L2 existent on both sides of the central line L1 of the fuse portion function as a heater while at the same time suppressing the heat dissipation from the central line L1. Thus, the central line L1 is easily heated, so that the fuse portion can be heated to a higher temperature. This indicates that the current value required to blow out the fuse can be reduced.

The distance between the central line L1 and each of the side lines L2 is desirably approximately equal to the width of one fuse wire.

To generate heat locally at the fuse portion FP, the current density is required to be sharply increased in the fuse portion FP. For this purpose, as shown in FIG. 5, the pads PD constituting fuse leads have a larger sectional area (sectional area along the fuse width) than the fuse portion FP1.

In this configuration, it is necessary to take note of the relative positions of the pads PD and the fuse portion FP1.

Specifically, the pads PD are larger in volume than the fuse portion FP1 and therefore function as a sink of the heat dissipated from the fuse portion FP1 thereby to suppress the temperature increase of the fuse portion FP1. Unless the proper distance is maintained between the pads PD and the fuse portion FP1, therefore, the fuse portion FP1 cannot be blown out with the design current and the current is required to be increased.

In view of this, the optimization of the relative positions of the pads PD and the fuse portion FP1 is explained with reference to FIGS. 10 to 13.

Figure 10:
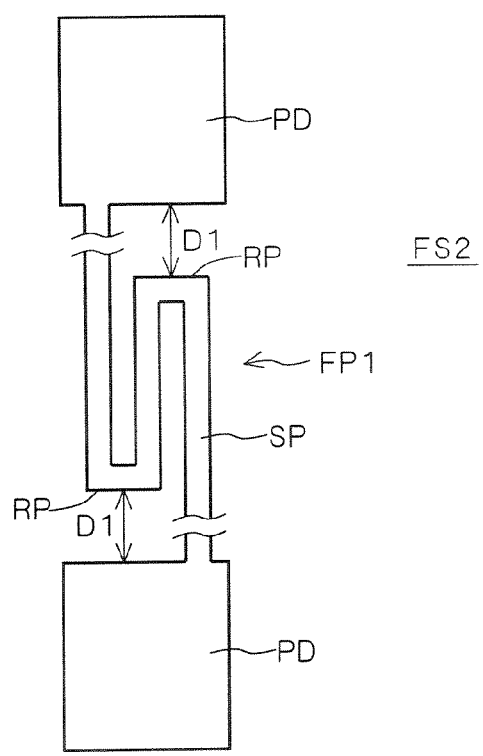
FIG. 10 is a plan view showing a fuse according to the first embodiment of the present invention.
Figure 11:
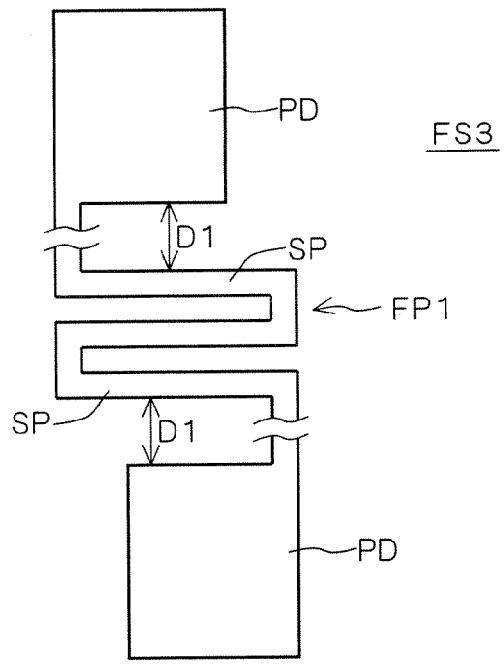
FIG. 11 is a plan view showing a fuse according to the first embodiment of the present invention.

FIGS. 10, 11 each show an example of layout of the fuse portion FP1 with respect to the pads PD. FIG. 10 shows a fuse FS2 in which the fuse portion FP1 is folded back in the direction parallel to the arrangement of the pads PD, and FIG. 11 shows a fuse FS3 in which the fuse portion FP1 is folded back in the direction perpendicular to the arrangement of the pads PD.

The distance between the pads PD and the fuse portion FP1 is defined by the distance between the side of the pads PD facing the fuse portion FP1 and the nearest fuse portion FP1 faced by the particular side.

In the fuse FS2 shown in FIG. 10, for example, the distance D1 between the turn RP of the fuse portion FP1 and the nearest pad PD is defined as the distance between the pads PD and the fuse portion FP1, while in the fuse FS3, the distance D1 between the linear portion SP of the fuse portion FP1 and the nearest pad PD is defined as the distance between the pads PD and the fuse FP1.

In determining this distance D1, the conduction of the heat dissipated from the fuse portion FP1 into the environment is required to be taken into consideration.

Generally, the fuse portion FP1 is formed in an insulating film of silicon oxide or the like on the semiconductor substrate. By calculating the time before 1100° C. near the melting point of copper is reached in the insulating film around the fuse portion FP1, therefore, the optimum distance between the pads PD and the fuse portion FP1 can be determined.

Figure 12:
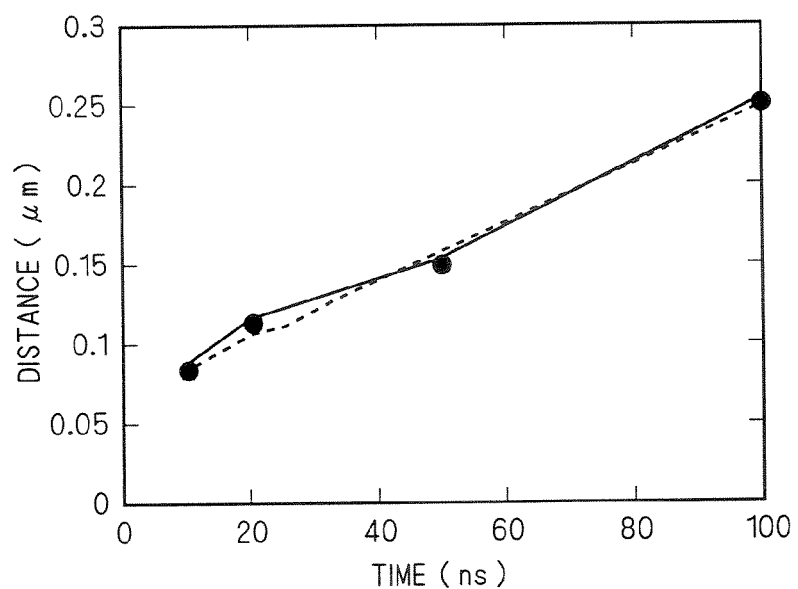
FIG. 12 is a diagram showing the result of simulation of the time when the temperature reaches 1100° C. at each point in the planar environment of the fuse portion arranged in the insulating film.

FIG. 12 is a diagram showing the result of simulation of the time when each point in the planar environment reaches 1100° C. with the fuse portion FP1 arranged in the insulating film. The abscissa represents the time (nsec) and the ordinate represents the distance (μm) from the fuse portion FP1.

It is understood that the distance in FIG. 12 is from the transverse end surface of a copper wire making up the fuse portion FP1, and a linear relation holds between distance and time.

With the lapse of time, therefore, even a far point reaches 1100° C. The time required to blow out the fuse is about 1 μsec (1000 nsec), and as long as the pads PD are arranged farther than a point where 1100° C. is reached within that time, the situation is prevented in which heat flows in the pads PD and the temperature of the fuse portion FP1 fails to rise.

In FIG. 12, it is understood that a point up to 0.25 μm reaches 1100° C. within 100 nsec, and the distance covered with the lapse of longer time is determined by extrapolation. The result is shown in FIG. 13.

Figure 13:
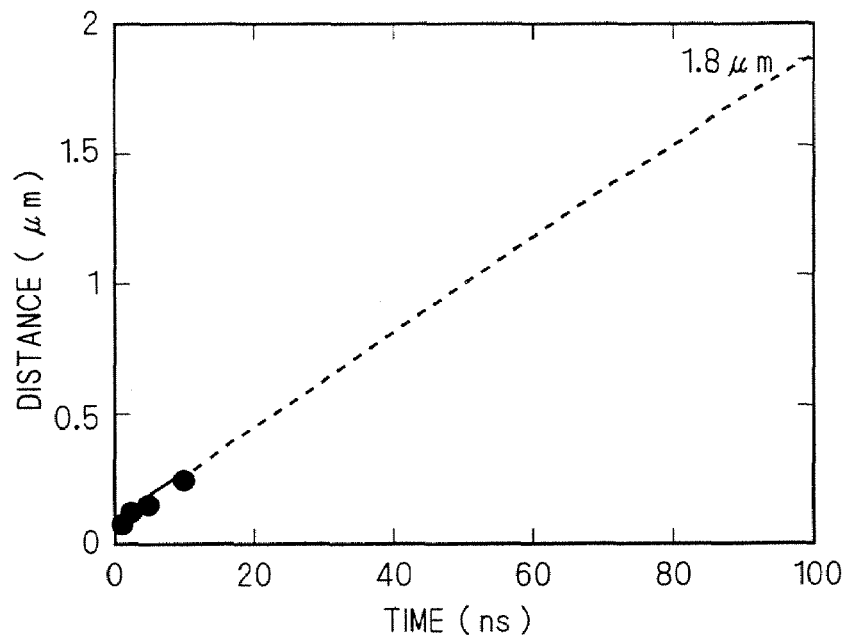
FIG. 13 is a diagram for determining, by extrapolation, the time when the temperature reaches 1100° C. at each point in the planar environment of the fuse portion in the insulating film.

In FIG. 13, the abscissa represents the time of 0 to 1000 nsec, and the ordinate represents the distance of 0 to 2.0 μm. The simulation result of FIG. 12 is also shown, and the distance covered after the lapse of 1000 nsec is extrapolated using a straight line obtained from the linear characteristic.

As a result, after the lapse of 1000 nsec, it has been found that the temperature of 1100° C. is reached at a point up to about 1.8 μm from the fuse portion FP1. This value is the distance at which 1100° C., i.e., the temperature near the melting point is reached. A lower temperature is reached at a farther point within the same time, and this distance is changed with the time required to blow out the fuse.

Thus, the optimum distance between the pads PD and the fuse portion FP1 is defined in the range of 1.5 to 2.0 μm allowing for the margin of 10 to 20%.

The value of 1.5 to 2.0 μm corresponds to about 10 to 14 times the line width 0.14 μm of the fuse portion FP1, and therefore the pads PD and the fuse portion FP1 are separated at least by the distance equal to ten times the fuse width.

In the case where the pads PD and the fuse portion FP1 are separated from each other by the distance equal to at least ten times the fuse width as described above, the situation is prevented in which the heat dissipated from the fuse portion FP1 is absorbed into the pads PD and the temperature rise of the fuse portion FP1 is suppressed.

In the layout shown in FIG. 10, the turns RP of the fuse portion FP1 face the pads PD. The length of the fuse portion FP1 facing each pad PD, therefore, is equal to the length of the turn RP and much shorter than the linear portion. Less heat is dissipated from the turns RP and a lesser amount of heat is absorbed into the pads PD, so that the fuse portion FP1 can be heated more efficiently.

In the layout shown in FIG. 11, on the other hand, the linear portion SP of the fuse portion FP1 faces the pads PD, and therefore the length of the fuse portion FP1 facing each pad PD is equal to the length of a part of each linear portion SP. The linear portion SP is longer than one side of the pad PD. Therefore, the linear portion SP faces substantially the whole of one side of the pad PD. By maintaining the optimal position between the pads PD and the fuse portion FP1 as described above, however, the amount of heat absorbed into the pads PD can be reduced and the fuse portion FP1 is efficiently heated.

In FIGS. 10, 11, the two pads PD are arranged with the fuse portion FP1 therebetween. In the case where the number of the turns of the fuse portion is an even number, however, the two ends of the fuse portion are arranged along the same direction so that the two pads are arranged on one side of the fuse portion. This configuration of course can also be employed.

A-4. Effects

As explained above, according to the first embodiment of the present invention, the fuse portion FP1 assumes a meandering form. As long as the fuse length and the supplied current are the same, therefore, the fuse can be heated more efficiently than the linear fuse.

In determining the total length of the fuse portion FP1, the temperature dependency of the electric resistivity of the fuse material is taken into consideration. Therefore, a defective situation is prevented in which the total length of the fuse portion FP1 is so long that the voltage drop across the fuse portion FP is too large and a sufficient current cannot be supplied.

Also, the distance between the fuse portion FP1 and the pads PD is longer than ten times the fuse width. The situation can be prevented, therefore, in which the heat dissipated by the fuse portion FP is absorbed into the pads PD and the temperature rise of the fuse portion FP1 is suppressed.

Further, the fuse portion FP1 is laid out in such a manner that the direction of the turns of the fuse portion FP1 is parallel to the direction in which the pads PD are arranged. Thus, the length of the fuse portion FP1 facing the pads PD is the same as the length of each turn RP, and less heat is absorbed into the pads PD. In this way, the fuse portion FP1 can be heated more efficiently.

A-5. Modifications

The fuses FS1 to FS3 shown in FIGS. 5, 10, 11 are in such a shape as to be folded back in a plane parallel to the main surface of the semiconductor substrate. In other words, the fuse wire assumes a two-dimensionally meandering form.

The direction in which the fuse wire is folded back, however, is not limited in a plane parallel to the main surface of the semiconductor substrate, and can alternatively be folded back in a plane perpendicular to the main surface of the semiconductor substrate into a three-dimensional meandering form.

Figure 14:
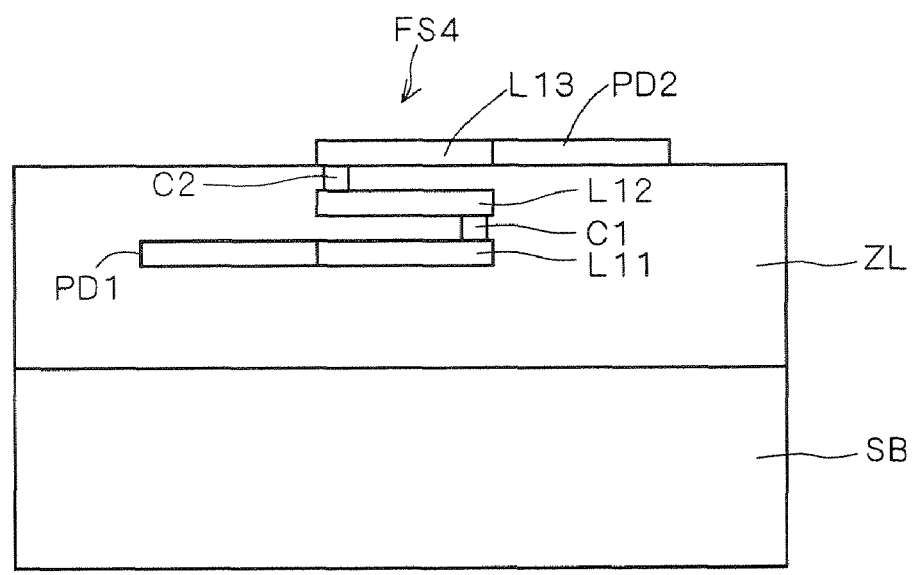
FIG. 14 is a sectional view showing a three-dimensionally meandering fuse wire.

FIG. 14 is a sectional view showing a configuration in which the fuse meanders three-dimensionally.

As shown in FIG. 14, a inter-layer insulating film ZL is arranged on the main surface of the semiconductor substrate SB, and the fuse FS4 is arranged in the surface of the inter-layer insulating film ZL.

In the fuse FS4, an end of the linear fuse wire L11 located in the lowest layer is connected to the pad PD1, and the upper surface of the other end thereof is connected with a via contact C1.

The via contact C1 is connected to the lower surface of one end of the fuse wire L12 arranged along the fuse wire L11 in the layer above the fuse wire L11.

The upper surface of the other end of the fuse wire L12 is connected to a via contact C2, which in turn is connected to the lower surface of one end of the fuse wire L13 arranged along the fuse wire L12 in the layer above the fuse wire L12. The other end of the fuse wire L13 is connected to the pad PD2.

The inter-layer insulating film ZL, though described as a single-layer film for convenience' sake, is actually a multi-layer film configured of insulating films in at least three layers. At least one insulating film is inserted between the semiconductor substrate SB and the fuse wire L11, between the fuse wires L11 and L12 and between the fuse wires L12 and L13.

The fuse FS4 is formed in a single layer and not in a plurality of layers to unify the material and the width of the fuse wires.

Figure 15:
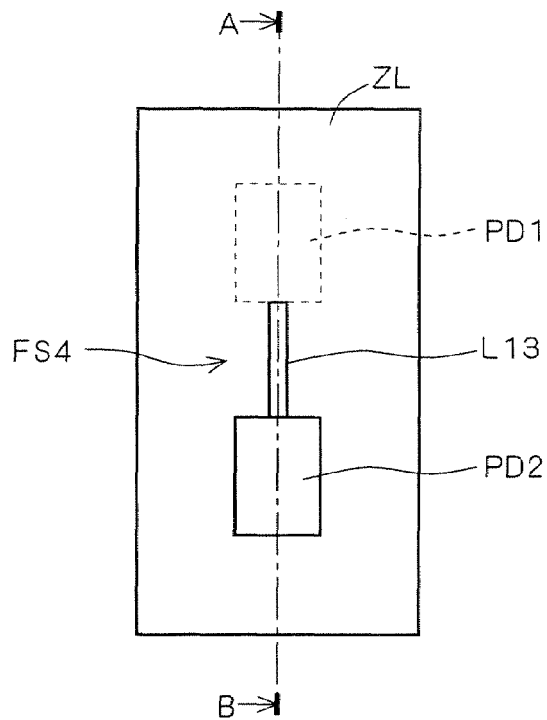
FIG. 15 is a plan view showing a three-dimensionally meandering fuse wire.

FIG. 15 is a top plan view of the fuse FS4 taken from above the layer insulating film ZL. The sectional view taken in line A-B in FIG. 15 corresponds to the configuration shown in FIG. 14.

In FIG. 15, the pads PD1, PD2 are arranged not to be overlaid on each other and formed with the inter-layer insulating film ZL therebetween. In the case where the number of turns of the fuse portion is an even number, however, the two ends of the fuse portion are arranged in the same direction, and therefore the two pads are arranged overlaid one on each other with the inter-layer insulating film ZL therebetween. The latter configuration can of course be employed as an alternative.

Also with the configuration described above, the fuse can of course be heated efficiently.

B. Second Embodiment

In the first embodiment, the optimization of the structure of the current blown fuse to reduce the blowout current is explained. In the second embodiment of the present invention, on the other hand, a method of blowing out the fuse to reduce the blowout current by applying a current in pulse form is explained.

The method according to this embodiment is not limited to a meandering fuse such as the fuses FS1 to FS3 according to the first embodiment shown in FIGS. 5, 10, 11, and may alternatively be a linear fuse like the fuse FS shown in FIG. 1. In the following description, therefore, the shape of the fuse is not specifically limited.

B-1. Continuous Application of Blowout Current

Figure 16:
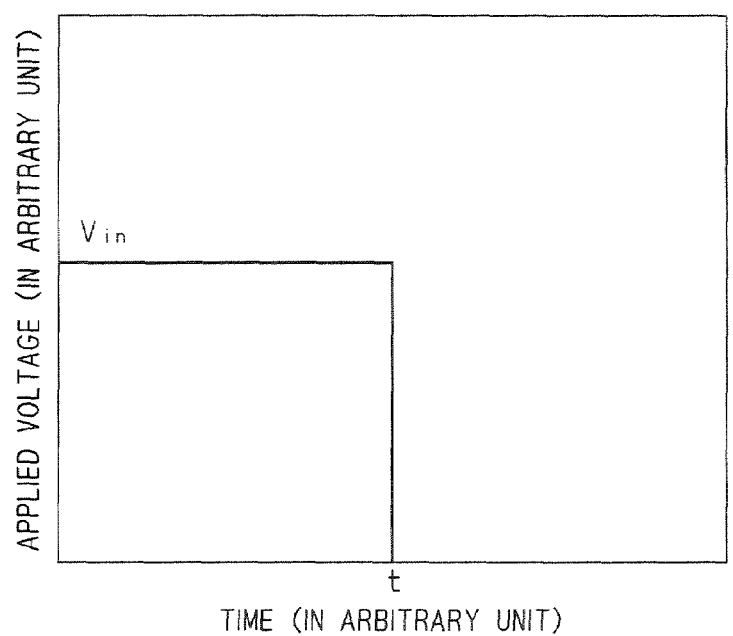
FIG. 16 is a diagram schematically showing the continuous application of a blowout current generally carried out for blowing out the fuse.

FIG. 16 is a diagram schematically showing the continuous application of the blowout current generally carried out for blowing out the fuse.

In FIG. 16, the abscissa represents the elapsed time (arbitrary unit) and the ordinate represents the voltage applied to the fuse (arbitrary unit).

As shown in FIG. 16, the fuse is generally blown out by applying a predetermined voltage Vin to the blowout time t continuously by controlling the MOS transistor Q1 for fuse selection (FIG. 2). In this case, the current flowing in the fuse exhibits the characteristic shown in FIG. 17.

Figure 17:
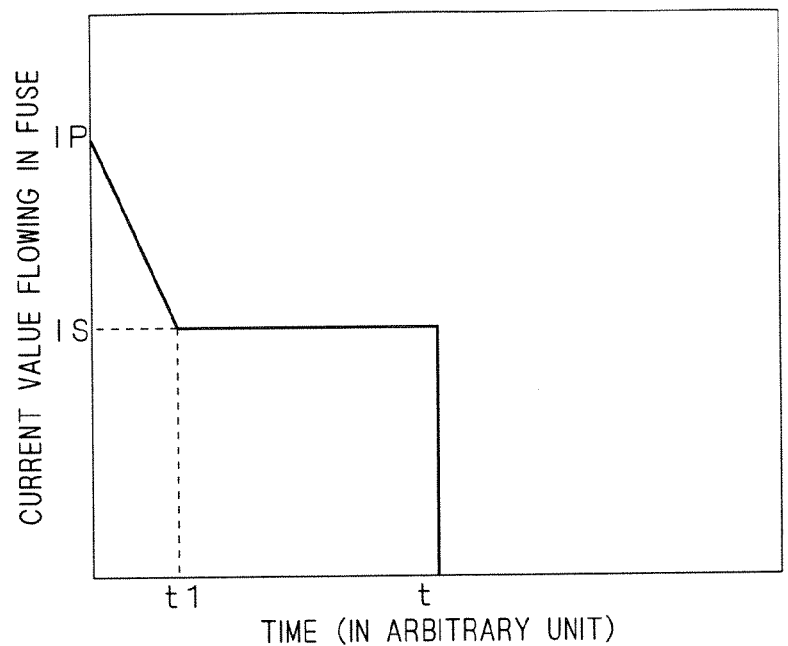
FIG. 17 is a diagram schematically showing the continuous application of a blowout current generally carried out for blowing out the fuse.

In FIG. 17, the abscissa represents the elapsed time (arbitrary unit) and the ordinate represents the current value flowing in the fuse (arbitrary unit).

As shown in FIG. 17, the current of the value IP flows in the fuse immediately after current application. This is what is called the initial instantaneous maximum current, and with the lapse of time, the current is reduced by the increase in the fuse resistance due to joule heat generation, until the current is reduced and finally assumes the value IS (hereinafter referred to as the balanced current) in thermal equilibrium. This value varies with the material, width and thickness of the fuse and cannot be specified, but always exhibits the characteristic as shown in FIG. 17.

Although the transition to the balanced state exhibits a characteristic along a gentle curve, the curve is shown critically for convenience' sake in FIG. 17. As shown in FIG. 17, the critical point to the balanced state occurs at time t1.

In the case where the blowout current is continuously applied as shown in FIG. 17, the heat amount P1 applied to the fuse is expressed by Equation 4 below based on the characteristic shown in FIG. 17.

$$P1 = IS \times t + t1(IP-IS)/2 \qquad (4)$$

This continuous application of the blowout current lasts long in a state where the temperature increase is slower and the current value is balanced. Therefore, the heating efficiency is considered low.

B-2. Blowout Current Application in Pulses

In view of this, the present inventors, considering that the heating efficiency is high in the state where the current continues to be reduced with a sharp temperature increase, i.e., in the transition state, have created a technical concept of applying the blowout current in pulse form by applying the voltage pulses as a method of maintaining the transition state.

Figure 18:
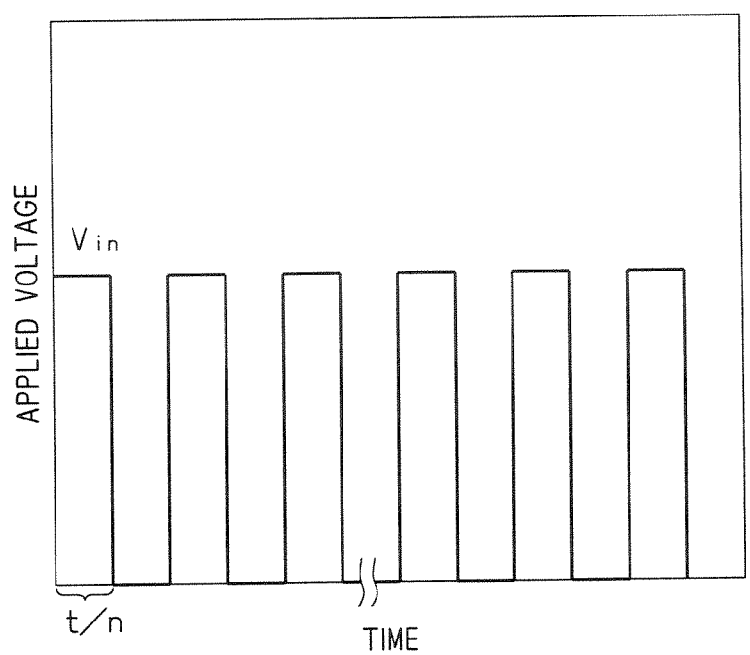
FIG. 18 is a diagram schematically showing the application of the blowout current in pulses.

FIG. 18 shows the state in which a predetermined voltage Vin is applied in pulses for the time length t/n each time, where t is the blowout time upon continuous application of the blowout current and n is an arbitrary integer to equally divide the blowout time. The value t/n is set not to exceed t1 shown in FIG. 17.

Figure 19:
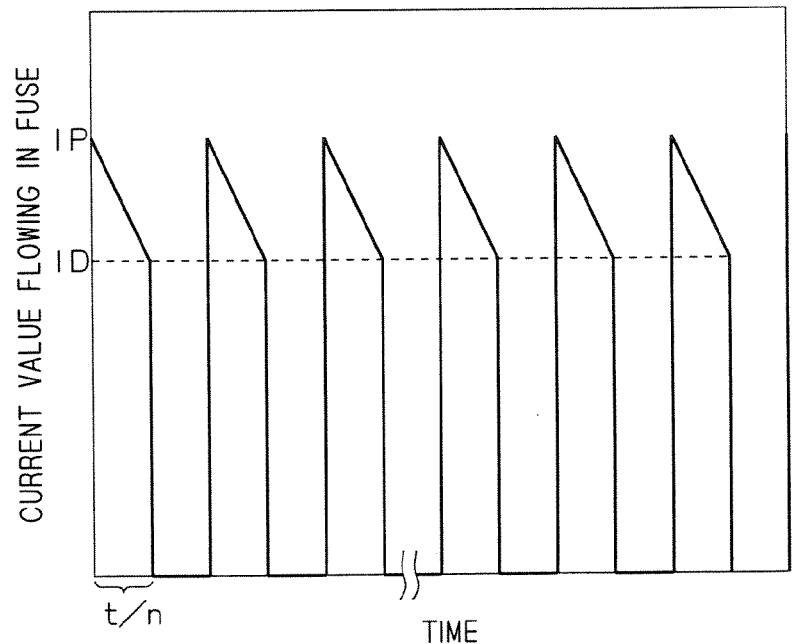
FIG. 19 is a diagram schematically showing the application of the blowout current in pulses.

Upon application of a voltage in pulses as described above, the current flowing in the fuse exhibits the characteristic shown in FIG. 19.

As shown in FIG. 19, like the characteristic shown in FIG. 17, the current flowing in the fuse assumes the current value IP immediately after current application, and with the lapse of time, the current is reduced by the increase in the fuse resistance due to joule heat generation. At time t/n, the voltage application is provisionally suspended, and the current value is reduced to zero from the current value ID.

Upon subsequent voltage application after a predetermined suspension period, the current IP flows immediately, and with the lapse of time, the current is reduced, until the current value is reduced to zero upon lapse of time t/n. This operation is repeated so that the fuse can be more efficiently heated than when the blowout current is continuously applied.

In the case where the blowout current is applied in pulses as shown in FIG. 19, the heat amount P2 applied to the fuse is expressed by Equation 5 based on the characteristic of FIG. 19.

$$P2 = ID \times t + t(IP-ID)/2 \qquad (5)$$

It is apparent that P2 is larger than P1 in the case where the pulses are suspended to increase at least the current ID beyond the current IS, i.e., before the blowout current becomes the balanced current value IS.

Also in the case where ID is set equal to IS, P2 is larger than P1 by only the amount corresponding to the second term of Equation 5.

As explained above, even in the case where the same current is applied to the fuse for the same time, the application of the current in pulses makes it possible to supply a larger heat amount to the fuse, and therefore the current required to blow out the fuse is reduced.

Also, the application of the current in pulses can suppress the thermal effect on the fuse environment.

Specifically, in the case where the current is continuously applied up to time t as shown in FIG. 17, the fuse material reaches the melting point at position S1, for example, in the area around the fuse, while in the case where the current is applied as pulses, on the other hand, the fuse is heated followed by suspending the operation until the temperature returns to the original level. Thus the point S2 where the fuse material reaches the melting point in the area around the fuse is smaller than the point S1.

As described above, the current application as pulses can suppress the thermal influence on the fuse environment, and therefore, the fuse area can be shrunk in the circuit design of the semiconductor device.

In the case where the pulse application time is excessively reduced to avoid damage to the fuse environment, however, the fuse may no longer be able to be blown out.

Specifically, the fuse is required to be heated up to at least the melting point to blow out. Therefore, it is necessary to set the pulse application time at least to a length sufficient for the fuse temperature to increase to at least the melting point.

Assume that the wire W μm wide, H μm thick and L μm long is used as a fuse. Let c be the specific heat, ρ the density of the wire material, and Q the heat amount applied per unit time. The time Tm required to reach the melting point is expressed by Equation 6 below.

$$Tm > \{(L \times W \times H) \times c \times \rho\}/Q \qquad (6)$$

Thus, the current is required to continue to be applied for at least the time length Tm. The application of pulses for an excessively long time, however, is equivalent to the continuous current application. Once the temperature increases to a point near the melting point, therefore, the pulses are suspended and the fuse is cooled, after which the temperature is increased to a level near the melting point. By repeating this temperature cycle, the fuse can be finally blown out.

Table 2 below shows the time length of pulse application of 10 mA to fuses of Al and Cu having the width W equal to the thickness H required for the fuse to reach the melting point or higher.

TABLE 2

| Material | Specific heat (kJ/)(kgK) | Melting point (° C.) | Current (mA) | Wire thickness (μm) | Wire width (μm) | Wire length (μm) | Density (kg/m$^3$) | Time before reaching melting point (μsec) |
|---|---|---|---|---|---|---|---|---|
| Al | 0.905 | 660.4 | 10 | 0.1 | 0.1 | 8 | 2690 | 0.057 |
| Cu | 0.47 | 1084.5 | 10 | 0.1 | 0.1 | 8 | 8500 | 0.265 |

Table 2 indicates that about 0.3 μsec is required for the copper fuse to reach the melting point. Considering the fact that the fuse blowout time is 1 μsec in the case of continuous current application, the fuse can be blown out by applying pulses three or four times.

Also, in the case where the current in pulse form is applied, the applied voltage required for blowout can be reduced.

Figure 20:
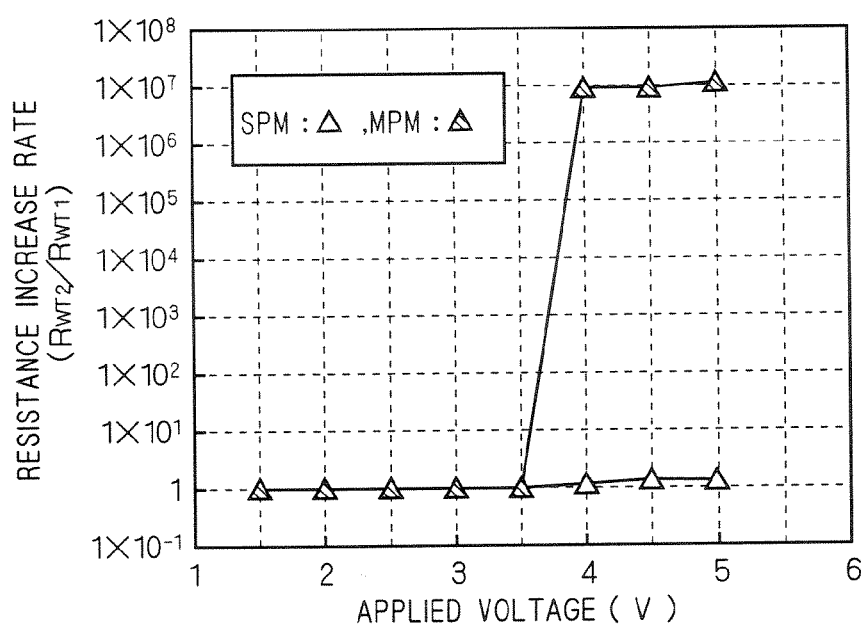
FIG. 20 is a diagram showing the rate at which the fuse resistance increases with respect to the applied voltage.

FIG. 20 is a diagram showing the resistance increase rate ($R_{WT2}/R_{WT1}$) of the fuse with respect to the applied voltage (V), and shows the characteristics for the mode SPM in which the current is continuously applied and the mode MPM in which the current is applied in pulses. To obtain the characteristics shown in FIG. 20, the current is applied to the fuse for the same total time in mode SPM and mode MPM.

The resistance increase rate ($R_{WT2}/R_{WT1}$) is a value that can be obtained by measuring the resistance value $R_{WT1}$ immediately before fuse blowout and the resistance value $R_{WT2}$ immediately after fuse blowout. The fuse blowout sharply decreases the resistance value, and therefore the fuse blowout can be determined from the sharp change in $R_{WT2}/R_{WT1}$.

In FIG. 20, the current is not sufficient and the fuse is not blown out so that the resistance increase rate remains 1 for both modes SPM and MPM before the applied voltage reaches 3.5 V. Once the applied voltage exceeds 3.5 V, however, the fuse is blown out and the resistance increase rate rises on the order of seven digits in mode MPM.

In mode SPM, on the other hand, even in the case where the applied voltage is increased to 5 V, the fuse is not blown out and the resistance increase rate is increased only by the amount of the joule heat generation.

In this way, the applied voltage required for blowout can be reduced by applying the current in pulse form.

B-3. Effects

As explained above, according to the second embodiment of the present invention, the blowout current is applied a plurality of times in pulse form. Even in the case where the same current is applied to the fuse for the same time, therefore, a larger heat amount can be applied to the fuse and the current required to blow out the fuse can be reduced.

Also, the current application in pulse form can suppress the thermal effect on the fuse environment.

Further, the current application in pulse form can reduce the applied voltage required for blowout.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate; and
a fuse adapted to be blown out by a current, wherein said fuse includes:
a first wiring;
a second wiring;
a fuse portion having a fuse wire folded into a meandering form in a plane parallel to a main surface of said semiconductor substrate;
a first rectangular pad coupled to one end of said fuse portion via said first wiring, and having a side thereof longer than a width of said fuse wire; and
a second rectangular pad coupled to the other end of said fuse portion via said second wiring, and having a side thereof longer than the width of said fuse wire
wherein said first rectangular pad is separated from said fuse portion by a distance of at least ten times the width of said fuse wire via said first wiring, and said second rectangular pad is separated from said fuse portion by a distance of at least ten times the width of said fuse wire via said second wiring.

2. The semiconductor device according to claim 1, wherein
said first and second rectangular pads are arranged in opposed relation to each other with said fuse portion therebetween,
said fuse portion is laid with a direction of turns thereof parallel to a direction in which said first and second rectangular pads are arranged, and
a distance between each of said first and second rectangular pads and said fuse portion is defined by a distance between a turn of said fuse portion and the nearest one of said first and second rectangular pads.

3. The semiconductor device according to claim 1, wherein
said first and second rectangular pads are arranged in opposed relation to each other with said fuse portion therebetween,
said fuse portion is laid with a direction of turns thereof perpendicular to a direction in which said first and second rectangular pads are arranged, and
a distance between each of said first and second rectangular pads and said fuse portion is defined by a distance between the linear portion of said fuse portion and the nearest one of said first and second rectangular pads.

4. The semiconductor device according to claim 1, further comprising:
a MOS transistor connected in series to said fuse and adapted to be turned on so that the current flows in said fuse, wherein
said fuse portion has a total length that a voltage drop generated at said fuse portion and calculated in consideration of a rate of increase in an electric resistivity of said fuse wires due to a temperature increase of said fuse portion is smaller than a difference between a power supply voltage of said MOS transistor and a drain-source voltage required to supply a blowout current required to blow out the fuse.

5. A semiconductor device comprising:
a semiconductor substrate; and
a fuse adapted to be blown out by a current, wherein said fuse includes:
a fuse portion having a fuse wire folded into a meandering form in a plane perpendicular to a main surface of said semiconductor substrate; and
two rectangular pads connected to ends, respectively, of said fuse portion and having each side thereof larger than a width of said fuse wire,
said fuse portion is arranged in a multi-layer inter-layer insulating films arranged on said semiconductor substrate,
said fuse portion includes:
a plurality of linear fuse wires extending in parallel to the main surface of said semiconductor substrate, each of plurality of linear fuse wires arranged in each of said multi-layer insulating films so that each of plurality of linear fuse wires overlaps the others of plurality of linear fuse wires in plan view; and
a plurality of via contacts for connecting said fuse wires, and
each of said plurality of via contacts is arranged so that a current path in said fuse portion assumes a meandering form in cross sectional view.

* * * * *